United States Patent
Otsuka

(10) Patent No.: US 7,571,409 B2
(45) Date of Patent: Aug. 4, 2009

(54) CIRCUIT DESIGN DEVICE AND CIRCUIT DESIGN PROGRAM

(75) Inventor: Yasuo Otsuka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 53 days.

(21) Appl. No.: 11/476,769

(22) Filed: Jun. 29, 2006

(65) Prior Publication Data
US 2007/0006111 A1    Jan. 4, 2007

(30) Foreign Application Priority Data
Jul. 4, 2005    (JP)    ............................. 2005-194986

(51) Int. Cl.
  *G06F 17/50*    (2006.01)
(52) U.S. Cl. .............................. 716/10; 716/9; 716/12; 716/14
(58) Field of Classification Search ............. 716/3, 716/1, 7–10, 13, 12, 14
  See application file for complete search history.

(56) References Cited

U.S. PATENT DOCUMENTS 5,056,094 A * 10/1991 Whetsel ..................... 714/736
6,081,916 A * 6/2000 Whetsel, Jr. ................ 714/727
6,678,875 B2 * 1/2004 Pajak et al. .................. 716/11

FOREIGN PATENT DOCUMENTS

| JP | 10-144796 | 5/1998 |
| JP | 2001-084280 A | 3/2001 |

* cited by examiner

*Primary Examiner*—Sun J Lin
(74) *Attorney, Agent, or Firm*—Foley & Lardner LLP

(57) ABSTRACT

A placement and routing processing unit performs placement and routing processing on a customer circuit based on design data. An embedded circuit generation processing unit refers to a library including embedded circuit information, grasps physical positional relationships among elements such as terminals and wires, and checks whether the elements are short-circuited to each other or not. The library including embedded circuit information records a result of placement and routing output by the placement and routing processing unit, attribute information on a test circuit to be embedded into the customer circuit or terminal information and wire position information, and the like on the test circuit. The elements that are short-circuited to each other are incorporated into a netlist to be generated, as the elements constituting one net. The embedded circuit generation processing unit generates a netlist in which the test circuit is incorporated into the customer circuit and outputs the netlist as design data including design data on embedded circuit.

5 Claims, 6 Drawing Sheets

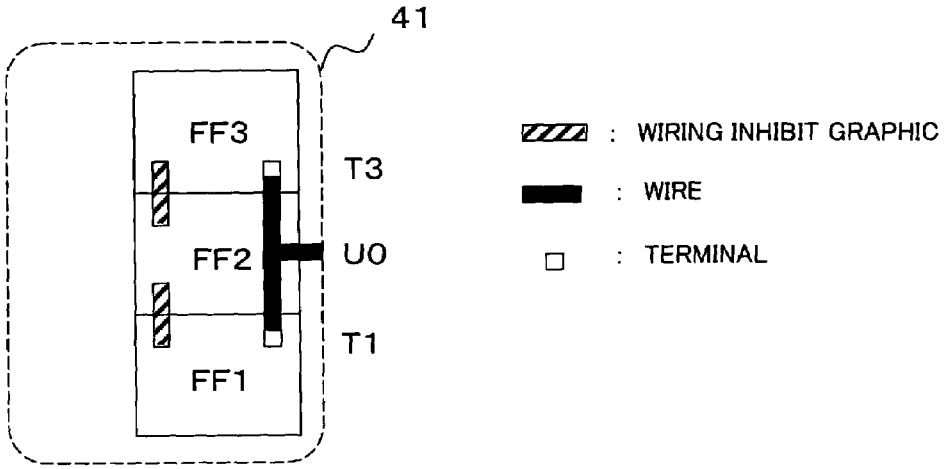
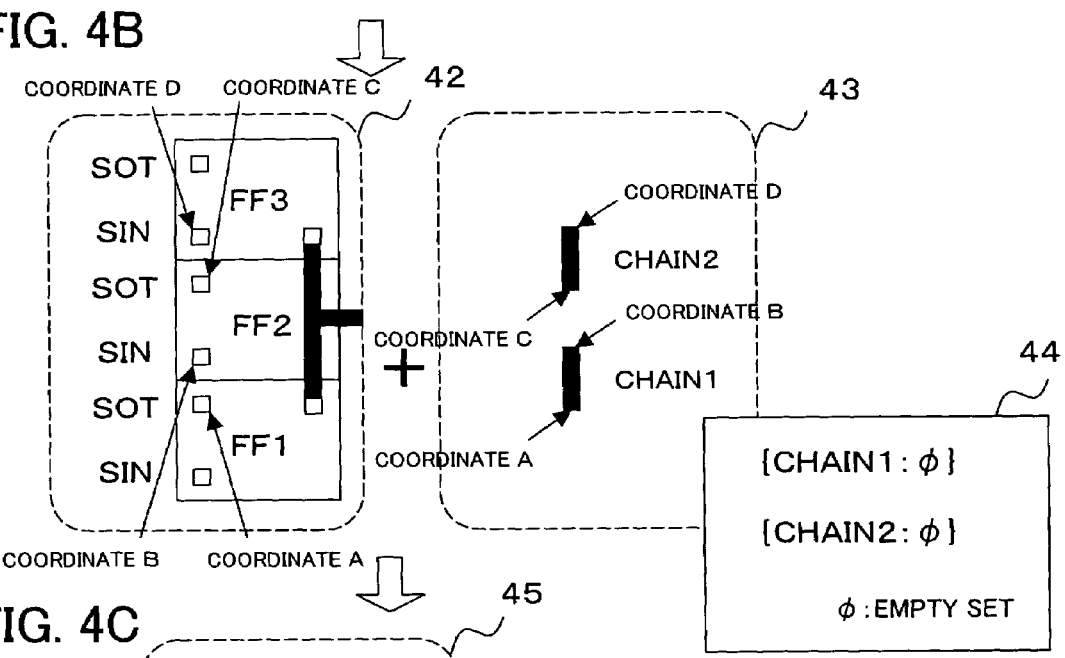
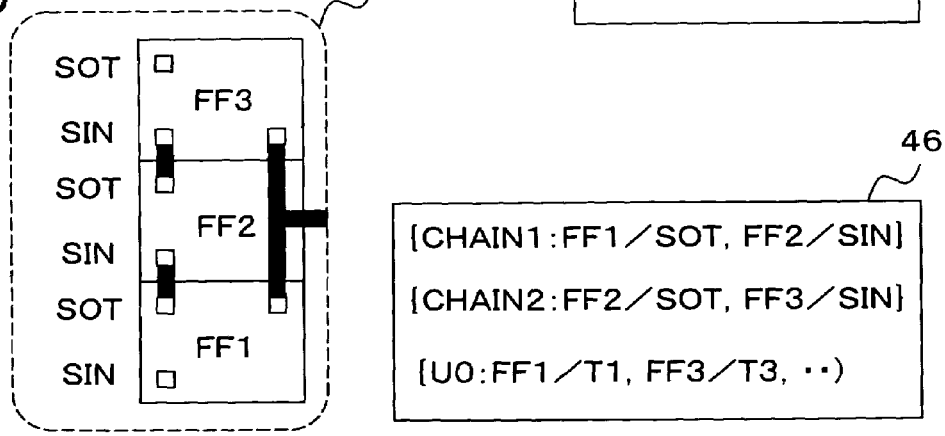

CIRCUIT DESIGN DEVICE AND CIRCUIT DESIGN PROGRAM

FIELD OF THE INVENTION

The present invention relates to a circuit design device and a circuit design program and method. More specifically, the invention relates to a device, method and program for designing a circuit in which an additional circuit is embedded in a circuit demanded by a customer.

BACKGROUND OF THE INVENTION

It is essential to prepare a test circuit for the circuit demanded by the customer (hereinafter referred to as a customer circuit) when designing LSIs or the like. Conventionally, the design is carried out according to a procedure in which the test circuit or the like is embedded into the customer circuit and then placement and routing is performed. The procedure to be performed by a circuit design device that performs the design as described above will be shown in FIG. 6. Referring to FIG. 6, an internal test circuit generation processing unit 102 in the circuit design device inputs customer circuit design data 101, embeds the test circuit inside the customer circuit, and generates data including data on internal test circuit 103. A placement and routing processing unit 104 performs placement and routing based on the data including data on internal test circuit 103 and outputs placement and routing result data including placement and routing result data on test circuit 105.

As a technique for performing the circuit design using the procedure as described above, insertion of the test circuit in a stage of logic synthesis before the placement and routing and performing the placement and routing is described in Patent Document 1, for example. Patent Document 2 describes reconfiguration of a netlist of the test circuit so that efficient routing processing can be performed while considering placement positional relationships among cells after the cells have been placed. In this case, the routing processing for the test circuit is performed at the same time as that for the customer circuit.

[Patent Document 1] JP Patent Kokai Publication No. JP-P-2001-84280A

[Patent Document 2] JP Patent Kokai Publication No. JP-A-10-144796

SUMMARY OF THE DISCLOSURE

In the prior arts, the placement and routing is performed using data obtained by adding data on the test circuit or the like to customer circuit data. Accordingly, a problem is present that a netlist configuration of the added test circuit or the like may influence the placement and routing of the customer circuit data. Specifically, by embedding the test circuit or the like and then performing the placement and routing, there arise cases where the customer circuit cannot be placed in an appropriate location on a chip or appropriate routing cannot be performed. A delay characteristic of the customer circuit may be therefore deteriorated. Thus, there is much to be desired in the art.

According to one aspect of the present invention, there is provided a circuit design device for designing a circuit with an additional circuit embedded in a circuit demanded by a customer. This circuit design device comprises:

a placement and routing processing unit that performs placement and routing based on design data on the customer circuit; and an embedded circuit generation processing unit that, referring to positional information on elements on an additional circuit to be embedded into the customer circuit, generates an additional circuit in the customer circuit for a result of the placement and routing output by the placement and routing processing unit.

According to another aspect of the present invention, there is provided a program for designing a circuit with an additional circuit embedded in a circuit demanded by a customer. The program causes a computer to perform the following steps:

a step of performing a placement and routing step based on design data on a customer circuit; and a step of referring to positional information on elements on the additional circuit to be embedded in the customer circuit and generating an additional circuit in the customer circuit for a result of the placement and routing obtained by the placement and routing step.

According to a further aspect of the present invention, there is provided a method for designing a circuit with an additional circuit embedded in a circuit demanded by a customer, hereinafter referred to as a customer circuit, said method comprising the steps as aforementioned in the program.

In the present invention, the mere term "wire or wiring" refers to a physically wired figure or a wired pattern drawn by routing processing by a layout toot. The term "net" refers to a group of terminals to be connected to each other (logic connection information) and a group (set) of routing information for connecting them.

The meritorious effects of the present invention are summarized as follows.

According to the present invention, the embedded circuit such as the test circuit is applied to data obtained after completion of placement and routing of the customer circuit. Thus, regardless of in whichever portion of the embedded circuit customer circuit cell(s) be placed, the netlist of the embedded circuit can be generated according to placement information. Accordingly, an influence on the customer circuit caused by the embedded circuit can be reduced.

BRIEF DESCRIPTION OF THE DRAWINGS

FIGS. 4A, 4B and 4C are diagrams schematically showing a layout when a test circuit is incorporated into a customer circuit;

PREFERRED EMBODIMENTS OF THE INVENTION

Figure 1:
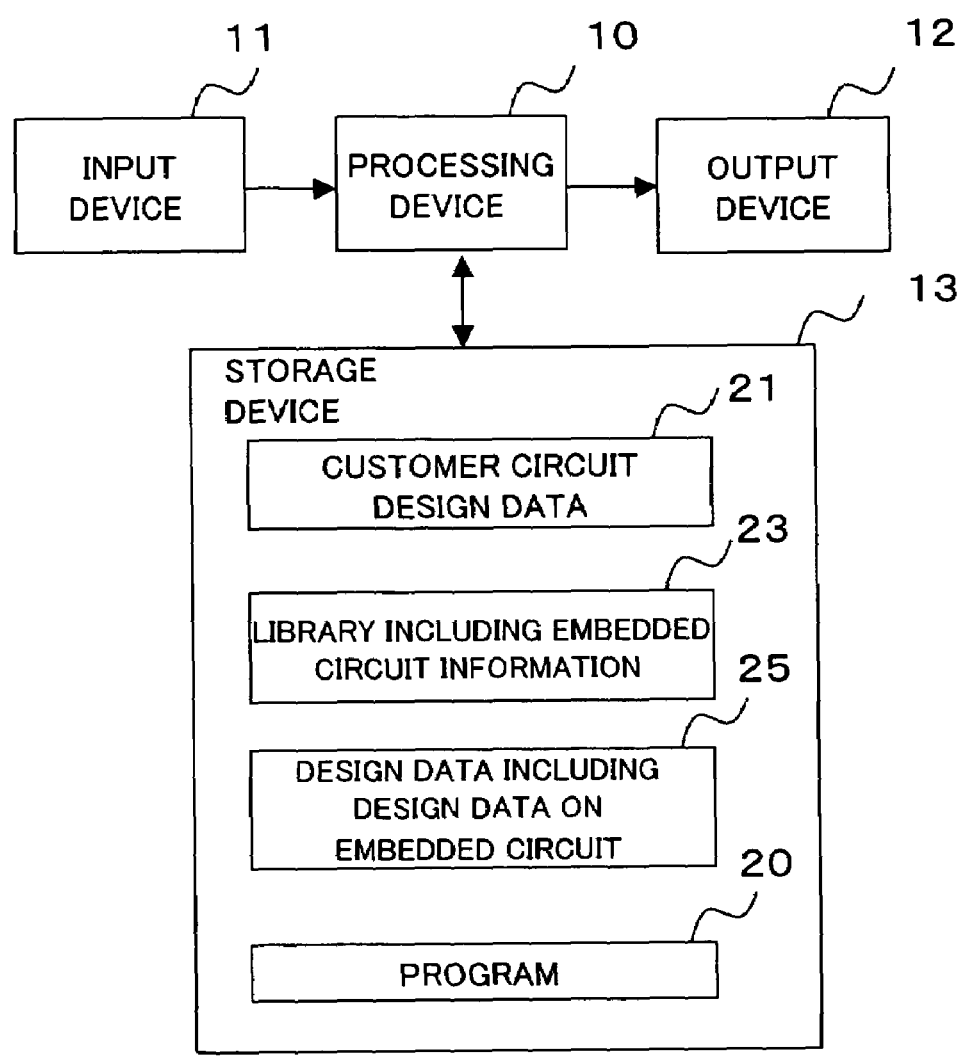
FIG. 1 is a block diagram showing a configuration of a circuit design device according to an embodiment of the present invention.

FIG. 1 is a block diagram showing a configuration of a circuit design device according to an embodiment of the present invention. Referring to FIG. 1, the circuit design device is constituted from an information processing device such as a personal computer or an engineering work station, and includes a processing device 10, an input device 11, an output device 12, and a storage device 13. The storage device 13 is constituted from a magnetic disk device or a semiconductor memory, and stores customer circuit design data 21, a library including embedded circuit information 23, design data including design data on embedded circuit 25, and a program 20 for implementing circuit design. The input device 11 is constituted from a keyboard, a mouse, or the like. The output device 12 is constituted from a display device, a printer, or the like. The processing device 10 inputs the data in the storage device 13 according to an input instruction from the input device 11, executes the program 20, writes a result in the storage device 13, and outputs the result to the output device 12 as necessary. Incidentally, referring to FIG. 1, it goes without saying that part of the input device 11, output device 12, or storage device 13 may be included in other device through a network not shown and may be remote-controlled.

Figure 2:
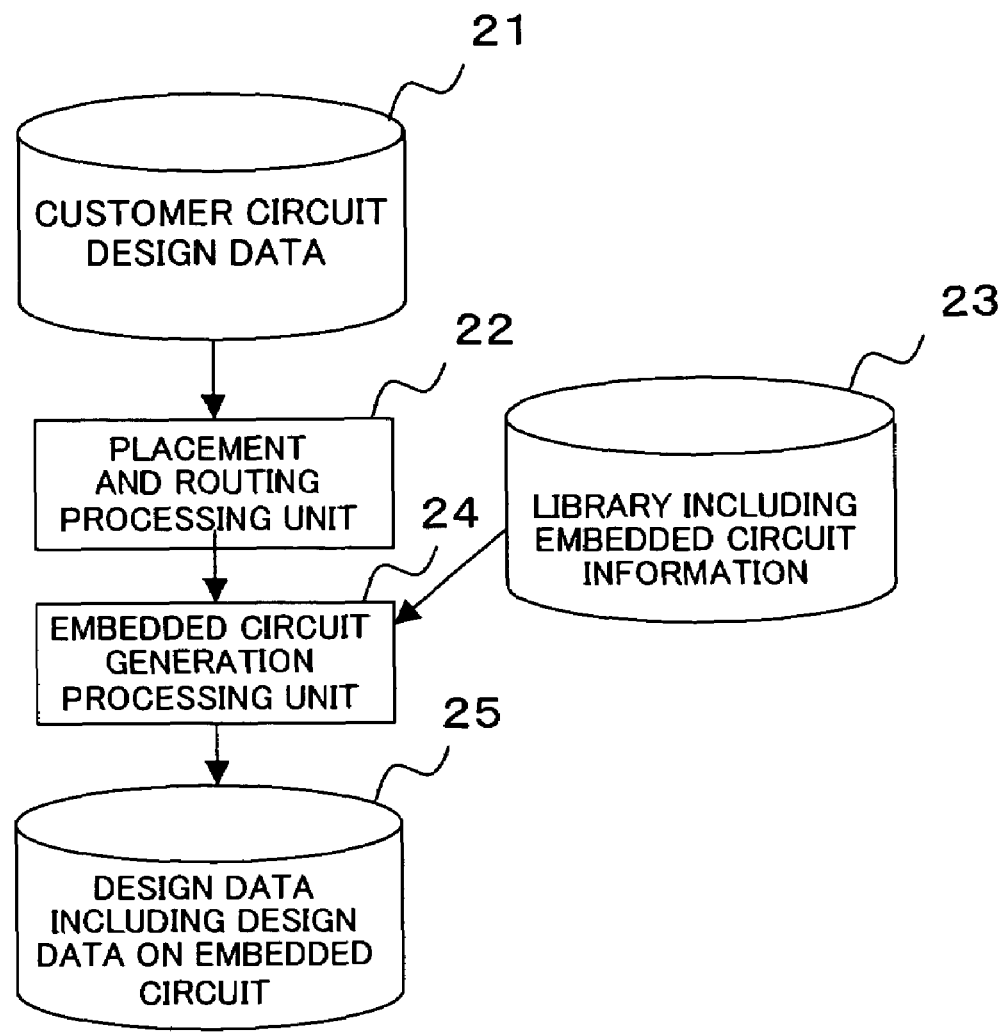
FIG. 2 is a block diagram showing a main functional portion of the circuit design device according to the embodiment of the present invention.

Next, a function of the circuit design device configured as described above will be described. FIG. 2 is a block diagram showing a main functional portion of the circuit design device according to the embodiment of the present invention. Referring to FIG. 2, the customer circuit design data 21 is the design data on a circuit targeted for design specified by a customer. A placement and routing processing unit 22 performs placement and routing processing on the customer circuit based on this design data. An embedded circuit generation processing unit 24 refers to the library including embedded circuit information 23 and obtains element-correspondence relationships between the result of the placement and routing and an embedded circuit. In the library including embedded circuit information 23, a result of the placement and routing (processing) output by the placement and routing processing unit 22, attribute information on the circuit to be embedded into the customer circuit or terminal information, wire position information, and the like of the circuit (or circuits) to be embedded are recorded. Specifically, the embedded circuit generation processing unit 24 grasps physical relationships among elements such as terminal(s) and wire(s) and checks whether a short circuit between the elements is present or not. The elements that are short-circuited are incorporated into a netlist to be generated, as a group of the elements that form one net. The embedded circuit generation processing unit 24 generates the netlist in which the embedded circuit is incorporated into the customer circuit, as described above, and outputs the netlist as the design data including design data on embedded circuit 25.

Figure 3:
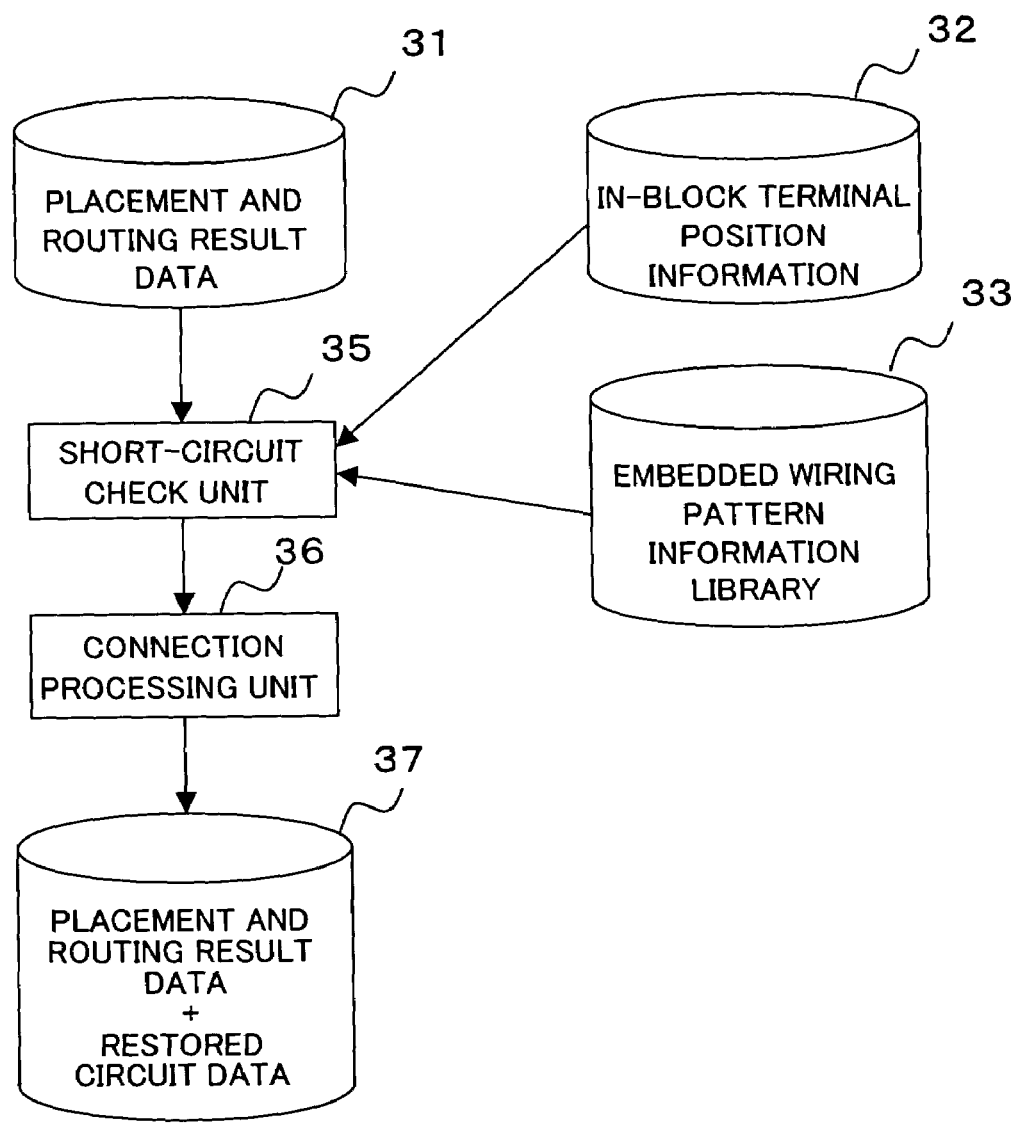
FIG. 3 is a block diagram showing details of an embedded circuit generation processing unit according to the embodiment of the present invention.

Next, details of the embedded circuit generation processing unit 24 will be described. FIG. 3 is a block diagram showing details of the embedded circuit generation processing unit according to the embodiment of the present invention. Referring to FIG. 3, the embedded circuit generation processing unit 24 includes a short-circuit check unit 35 and a connection processing unit 36. Placement and routing result data 31 is the data on a result of placement and routing (processing) on the customer circuit with no short-circuit errors, output by the placement and routing processing unit 22 in FIG. 2. In-block terminal position information 32 is given as a general-purpose library and represents information on physical positions of the terminals, wires, and the like within a block. An embedded wiring pattern information library 33 is a dedicated library included in the library including embedded circuit information 23, and represents information on physical positions of terminals, wiring, and the like in the embedded circuit.

The short-circuit check unit 35 reads in the placement and routing result data 31, in-block terminal position information 32, and embedded wiring pattern information library 33, and checks whether each of the terminals in the embedded circuit is short-circuited with other terminal or other wire, based on coordinate information in each block.

The connection processing unit 36 incorporates terminals or wires determined to be short-circuited (i.e., to have a short-circuit) by the short-circuit check unit 35 into the netlist as a net connected also logically. That is, the short-circuited terminals or wires are generated as a new net. As a result, in the netlist showing the result of placement and routing (processing) output by the connection processing unit 36, there is a status where no short-circuited net is present. The connection processing unit 36 outputs placement and routing result data and restored circuit data 37 as the design data including design data on embedded circuit 25.

As described above, in the circuit design device according to the embodiment of the present invention, the elements determined to be physically connected by a short-circuit check are regarded as the elements connected also logically, to generate a netlist to such an extent, and output as the design data including design data on embedded circuit. That is, design is made so that the embedded circuit is embedded in response to the result of the placement and routing of the customer circuit. Thus, regardless of in whichever portion of the embedded circuit customer circuit cell(s) be placed, the netlist including the embedded circuit is generated according to placement information. Accordingly, it becomes hard to happen an occurrence where that the customer circuit cannot be placed in an appropriate location on a chip, or an occurrence where appropriate routing cannot be performed.

Further, the need for erasing test circuit data when data after the placement and routing (processing) such as timing information is returned to a customer, or the need for obtaining approval of the customer as to addition of the test circuit is eliminated.

First Embodiment

Next, a case where the embedded circuit is a test circuit is taken as an example, and a procedure when the test circuit is incorporated into a customer circuit will be described. FIGS. 4A, 4B and 4C include diagrams schematically showing a layout when the test circuit is incorporated into the customer circuit. Referring to FIG. 4A, a circuit block 41 is the customer circuit that is placed and routed by the placement and routing processing unit 22 in FIG. 2, and is constituted from cells FF1, FF2, and FF3. A terminal T1 is provided at the cell FF1, a terminal T3 is provided at the cell FF3, and the terminals T1 and T3 are connected by a wire U0, thereby being led out to an outside of the circuit block 41. In parts between the cells FF1 and FF2, between the cells FF2 and FF3, wiring inhibition regions each represented by a wiring inhibition graphic (hatched region) are set, respectively. This wiring inhibition graphic is defined in an LEF (library exchange format) for a layout design tool, for example, in the in-block terminal position information 32. The wiring inhibition regions are set in locations where embedded wires for the test circuit are present, so that a short-circuit error between wires of the customer circuit and the wires of the test circuit is prevented. Incidentally, the cell FF2 may be a fill cell with a terminal(s), which is not included in the customer circuit. This fill cell may also be used when a limitation that the customer circuit should not be placed in a position of the cell FF2 or the like is imposed.

Referring to FIG. 4B, a circuit block 42 illustrates superposed on the circuit block 41 terminal information on the embedded circuit stored in the in-block terminal position information 32 in FIG. 3. Herein, terminals SIN and SOT are added to the cells FF1, FF2, and FF3, respectively. The terminals SIN and SOT are a scan input terminal and a scan output terminal for a scan flip-flop for the test circuit, respectively, for example.

On the other hand, a circuit block 43 is given by the embedded wiring pattern information library 33 in FIG. 3, and includes wires CHAIN1 and CHAIN2. The wires CHAIN1 and CHAIN2 are described by a wiring information description 44. {CHAIN1: φ} and {CHAIN2: φ} mean that nothing is connected to the wire CHAIN1 nor the wire CHAIN2, respectively.

The short-circuit check unit 35 makes a short-circuit check on a terminal and a wire based on physical position information on the circuit blocks 42 and 43. The circuit blocks 42 and 43 respectively include information on coordinates A, B, C, and D, as shown in FIG. 4B. It is determined by the short-circuit check that the wire CHAIN1 and the terminal SOT of the cell FF1 are short-circuited at the coordinate A, and that the wire CHAIN1 and the terminal SIN of the cell FF2 are short-circuited at the coordinate B. Likewise, it is determined that the wire CHAIN2 and the terminal SOT of the cell FF2 are short-circuited at the coordinate C, and that the wire CHAIN2 and the terminal SIN of the cell FF3 are short-circuited at the coordinate D. Based on these results of the determination, the connection processing unit 36 in FIG. 3 prepares a wiring information description 46. {CHAIN1: FF1/SOT, FF2/SIN} in the wiring information description 46, for example, indicates that the wire CHAIN1 is connected to the terminal SOT of the cell FF1 and the terminal SIN of the cell FF2. The wire CAIN2 and the wire U0 are described in the same manner. A circuit block 45 in FIG. 4C indicates a circuit in which short-circuited portions in the circuit blocks 42 and 43 are connected as a result of processing by the connection processing unit 36.

The circuit block 45 and the wiring information description 46 are output as data on a design in which the test circuit is embedded in the customer circuit or the placement and routing result data and restored circuit data 37. Elements determined to be physically connected by the short-circuit check as described above are regarded as the elements connected logically as well. Then, a netlist is synthesized. The synthesized netlist is then provided to a customer as design data.

By embedding the test circuit into the customer circuit with the procedure as described above, circuit design is performed without causing the customer to be conscious of the presence of the internal test circuit. Further, by embedding the test circuit, placement and routing of the customer circuit is not changed, so that the customer circuit will not be influenced by the test circuit.

Second Embodiment

Figure 5A:
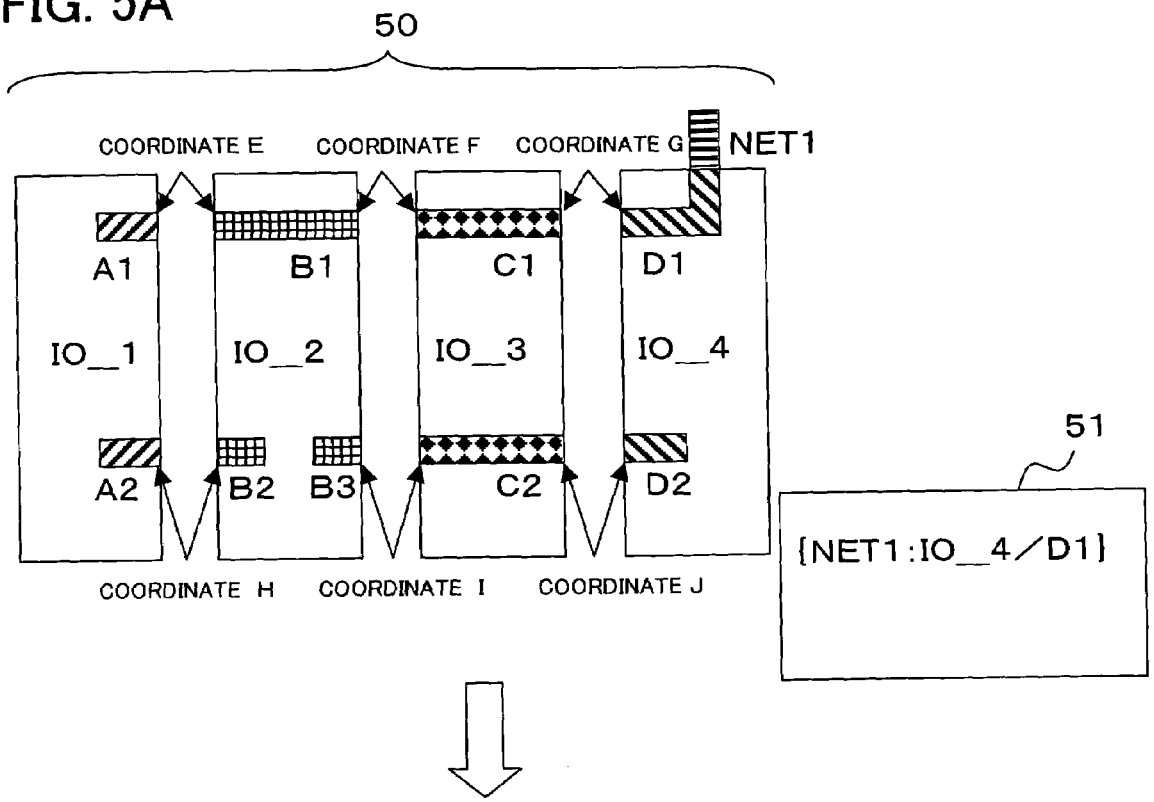
FIGS. 5A and 5B are diagrams schematically showing a layout when an I/O circuit is incorporated into a customer circuit.
Figure 5B:
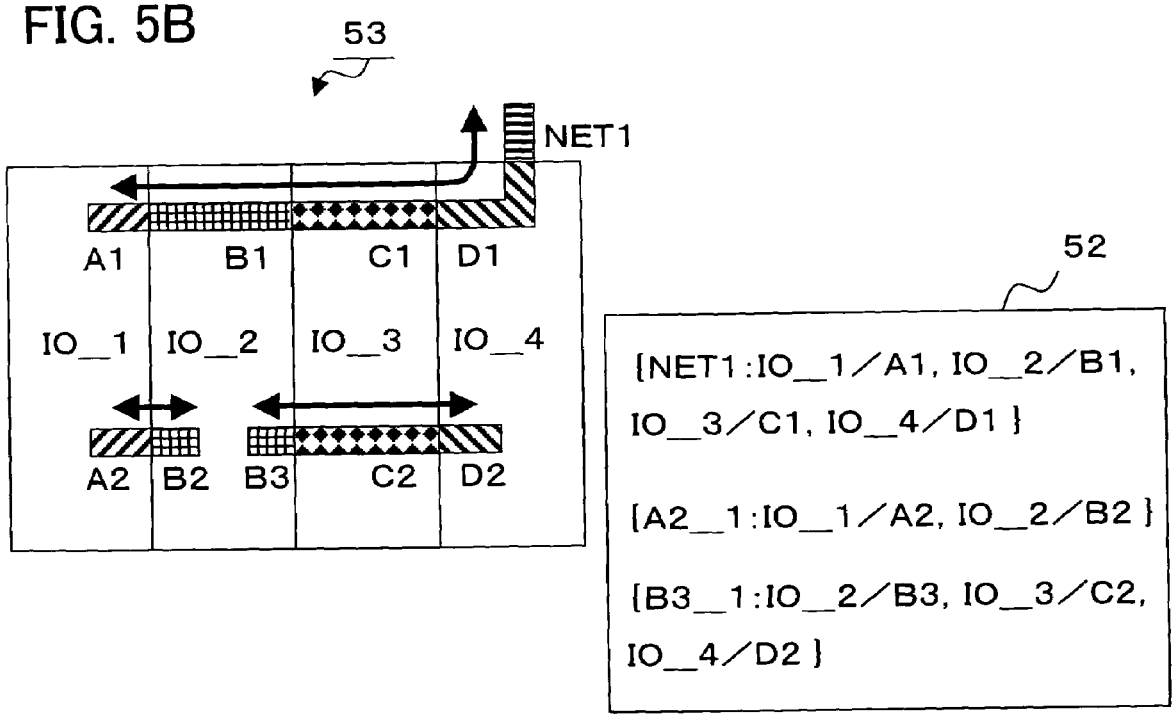
Figure 6:
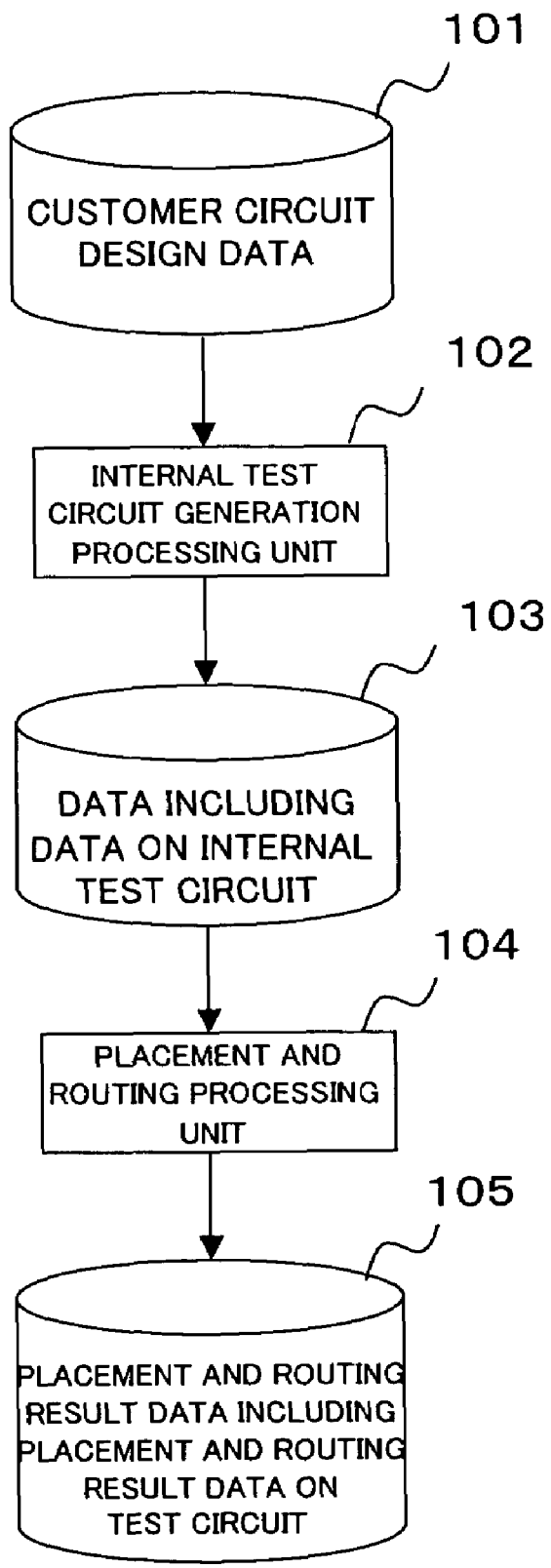
FIG. 6 is a diagram showing a design procedure in a conventional circuit design device.

Next, a case where the embedded circuit is an I/O (input/output) circuit is taken as an example, and a procedure for incorporating the I/O circuit into a customer circuit will be described. FIGS. 5A and 5B are diagrams schematically showing a layout when the I/O circuit is incorporated into the customer circuit. Referring to FIG. 5A, cells $IO_{13}$ 1, IO_2, IO_3, and IO_4 constituting cells 50 relate to cells for input/output, placed around the chip or the like. The cell IO_1 includes terminals A1 and A2, cell IO_2 includes terminals B1, B2, and B3, cell IO_3 includes terminals C1 and C2, and cell IO_4 includes terminals D1 and D2. Further, to the terminal D1, a wire NET1 is connected. In a state as shown in FIG. 5A, all the terminals except for the terminal D1 are isolated. The wire NET1 is described by a wiring information description 51. {NET1: IO_4/D1 } means that the wire NET1 is connected to the terminal D1 of the cell IO_4.

The short-circuit check unit 35 makes a short-circuit check of the terminals and the wires based on physical position information on the cells IO_1, IO_2, IO_3, and IO_4, as in the first embodiment. It is determined by this short-circuit check that the terminal A1 of the cell IO_1 and the terminal B1 of the cell IO_2 are short-circuited at the coordinate E, that the terminal B1 of the cell IO_2 and the terminal C1 of the cell IO_3 are short-circuited at the coordinate F, and that the terminal C1 of the cell IO_3 and the terminal D1 of the cell IO_4 are short-circuited at the coordinate G. Further, it is determined that the terminal A2 of the cell IO_1 and the terminal B2 of the cell IO_2 are short-circuited at the coordinate H, that the terminal B3 of the cell IO_2 and the terminal C2 of the cell IO_3 are short-circuited at the coordinate I, and that the terminal C2 of the cell IO_3 and the terminal D2 of the cell IO_4 are short-circuited at the coordinate J. Based on these results of the determination, the connection processing unit 36 in FIG. 3 prepares a wiring information description 52. {NET1:IO_1/A1, IO_2/B1, IO_3/C1 IO_4/D1} in the wiring information description 52, for example, indicates that the wire NET1 is connected to the terminal A1 of the cell IO_1, the terminal B1 of the cell IO2, the terminal C1 of the cell IO_3, and the terminal D1 of the cell IO_4. Further, {A2_1: IO_1/A2, IO_2/B2} means that the terminal A2 of the cell IO_1 and the terminal B2 of the cell IO_2 form a wire A2_1. Further, {B3_1: IO_2/B3, IO_3/C2, IO_4/D2} means that the terminal B3 of the cell IO_2, terminal C2 of the cell IO_3, and the terminal D2 of the cell IO_4 form a wire B3_1. The wire A2_1 or the wire B3_1 represents the wire that was not present on the customer circuit, but was the wire generated by the connection processing unit 36. The wire A2_1 or the wire B3_1 is used as a wire for a power source in the I/O circuit, for example. As described above, FIG. 5B shows a circuit block 53 in which short-circuited portions between the cells constituting the cells 50 shown in FIG. 5A are connected as a result of processing by the connection processing unit 36.

The circuit block 53 and the wiring information description 52 are output as data on a design in which the I/O circuit is incorporated, or the placement and routing result data and restored circuit data 37. Elements determined to be physically connected by the short-circuit check as described above are regarded as the elements connected logically as well. Then, a netlist is synthesized. The synthesized netlist is then provided to a customer as design data.

In the synthesis of the netlist, circuit design is performed without causing the customer to be conscious of the presence of internal wires. Further, by embedding the internal wires, placement and routing of the customer circuit is not changed, so that the customer circuit will not be influenced by the internal wires.

The foregoing description of the present invention was given in connection with the embodiments described above. The present invention, however, is not limited to the embodiments described above, and of course includes various variations and modifications that could be made by those skilled in the art within the scope of the inventions as set forth in the respective claims of the present application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A circuit design device for designing a circuit with an additional circuit embedded in a circuit demanded by a customer, hereinafter referred to as a customer circuit, said circuit design device comprising:
    a placement and routing processing unit that performs placement and routing based on design data on said customer circuit; and
    an embedded circuit generation processing unit that generates said circuit with an additional circuit embedded therein after completion of the placement and routing of the customer circuit, for a result of physical layout information output by said placement and routing processing unit, based on positional information on elements on said additional circuit, wherein said embedded circuit generation processing unit synthesizes a netlist by regarding said elements to be physically connected as well as logically connected to be short-circuited when said additional circuit is embedded according to the result of the placement and routing, and outputs said synthesized netlist.

2. The circuit design device according to claim 1, wherein said additional circuit is a circuit for testing said customer circuit.

3. The circuit design device according to claim 1, wherein said additional circuit is an internal circuit in an input/output circuit.

4. A computer readable program stored in a memory of a computer and to be executed by the computer in designing a circuit with an additional circuit embedded in a circuit demanded by a customer, hereinafter referred to as a customer circuit, said computer readable program comprising steps of:
    performing placement and routing based on design data on said customer circuit; and
    generating said circuit with an additional circuit embedded therein after completion of the placement and routing of the customer circuit, for a result of physical layout information output by said performing placement and routing step, based on positional information on elements on said additional circuit, wherein said generating step comprises: synthesizing a netlist by regarding said elements to be physically connected as well as logically connected to be short-circuited when said additional circuit is embedded according to the result of the placement and routing, followed by outputting said synthesized netlist.

5. A method for designing a circuit with an additional circuit embedded in a circuit demanded by a customer, hereinafter referred to as a customer circuit, said method comprising:
    a step of performing placement and routing based using a placement and routing processing unit on design data on said customer circuit; and
    a step of generating said circuit with an additional circuit embedded therein after completion of the placement and routing of the customer circuit, for a result of physical layout information output by said performing placement and routing step, based on positional information on elements on said additional circuit, wherein said generating step comprises: synthesizing a netlist by regarding said elements to be physically connected as well as logically connected to be short-circuited when said additional circuit is embedded according to the result of the placement and routing, followed by outputting said synthesized netlist.

* * * * *